United States Patent [19]

Ponte

[11] Patent Number: 4,755,727
[45] Date of Patent: Jul. 5, 1988

[54] FIELD DEFLECTION CIRCUIT FOR USE IN A PICTURE DISPLAY DEVICE

[75] Inventor: Edward M. Ponte, Eindhoven, Netherlands

[73] Assignee: U.S. Philips Corporation, New York, N.Y.

[21] Appl. No.: 929,938

[22] Filed: Nov. 12, 1986

[30] Foreign Application Priority Data

Nov. 12, 1985 [NL] Netherlands ................ 8503101

[51] Int. Cl.⁴ .................. H01J 29/70; H01J 29/72
[52] U.S. Cl. ................................ 315/389; 315/403; 315/408
[58] Field of Search ............. 315/403, 408, 387, 389

[56] References Cited

U.S. PATENT DOCUMENTS 3,988,638  10/1976  Nillesen ........................ 315/388
4,004,190  1/1977   Simpson ....................... 315/403
4,400,652  8/1983   Sunderland ................... 315/403
4,590,408  5/1986   Mays .......................... 315/403

FOREIGN PATENT DOCUMENTS 1078069  8/1967  United Kingdom.

Primary Examiner—Theodore M. Blum
Attorney, Agent, or Firm—Gregory P. Gadso

[57] ABSTRACT

A field deflection circuit for use in a picture display device, comprising an amplifier to whose output the series network of a field deflection coil, a separated capacitor and a negative feedback resistor is disclosed. A circuit is provided in parallel with the separating capacitor for fixing the d.c. component of the voltage across the capacitor at a more less constant value. Frequency-dependent negative feedback networks may therefore be omitted.

4 Claims, 1 Drawing Sheet

FIELD DEFLECTION CIRCUIT FOR USE IN A PICTURE DISPLAY DEVICE

BACKGROUND OF THE INVENTION

The invention relates to a field deflection circuit for use in a picture display device, comprising an amplifier having an input terminal for receiving a sawtooth-shaped signal of the field frequency, and an output terminal for applying a sawtooth-shaped deflection current having a trace and a retrace to a series network of a field deflection coil, a separating capacitor, and a negative feedback resistor, coupled to the said output terminal and also comprising means for feeding back the voltage across the negative feedback resistor to the amplifier.

In a field deflection circuit a d.c. coupled output amplifier, that is to say, without a separating capacitor can be used, on the condition that the amplifier has a double supply for supplying one voltage which is positive and one voltage which is negative with respect to a fixed potential, for example, ground to which the deflection coil is d.c. coupled. Such a double supply is expensive and makes it difficult to provide protection for the output amplifier.

A field deflection circuit having an a.c. coupled output amplifier, that is to say, with a capacitor for the d.c. separation of the deflection coil is therefore generally used. An example thereof has been described in German Patent Specification No. 1,462,870 (PHN.1254). Such a circuit has, however, drawbacks which the previously mentioned circuit does not have or has to a lesser extent. For example, the linearity of the deflection circuit is worse, so that correction means are to be provided in the circuit. These are, for example, negative feedback networks which must often be capable of being set and which comprise capacitors having a high capacitance. The said German patent specification also states that the input signal of the amplifier should have a parabolic component which is to be generated by a stage preceding the amplifier. Due to the frequency-dependent character of the elements of the circuit, particularly of the negative feedback networks, an a.c. coupled amplifier shows a worse behaviour in the case of rapid transients in the signal to be amplified than does a d.c. coupled amplifier, which may cause a vertical instability of the picture displayed. Interlacing may also be worse because the output signal from the amplifier comprises a picture frequency component due to the non-infinitely high capacitance of the capacitor.

SUMMARY OF THE INVENTION

The aforementioned drawbacks are known and may be eliminated in known manner, which leads, however, to complicated circuits comprising many elements. Moreover, these elements are liable to aging which may cause unwanted variations. It is an object of the invention to provide a field deflection circuit of the type described above, i.e. with an a.c. coupled amplifier, which does not have these drawbacks. To this end, the field deflection circuit according to the invention is characterized in that a circuit is provided in parallel with the separating capacitor for setting the d.c. component of the voltage across the capacitor at a more or less fixed value.

The measuring according to the invention ensures that the d.c. component of the voltage at the output of the amplifier also has a more or less fixed value. Consequently, the field deflection circuit behaves as a d.c. coupled circuit without a double supply being required. Therefore, the circuit does not have the drawbacks of the a.c. coupled circuits. More specifically, the circuit does not need to comprise frequency-dependent negative feedback networks so that vertical instability cannot occur and interlacing, even when receiving teletext signals is satisfactory. These favorable results were obtained with very simple means.

It will be noted that a television receiver marketed by Philips (see: "Service Manual, Colour Television, Chassis K12") comprises an a.c. coupled field deflection circuit with a provision for maintaining the d.c. component of the voltage present across the capacitor constant. However, in this circuit it is not the voltage across the resistor, but the voltage across the series network constituted by the resistor and the capacitor that is negatively fed back to the amplifier. This voltage has a parabolic component and as a result the input signal of the amplifier must also have a parabolic component, which must thus be generated.

The circuit according to the invention is preferably characterized in that the circuit provided in parallel with the separating capacitor is a circuit for setting the maximum value of the parabolic voltage present across the capacitor during the trace period at a more or less fixed value. Consequently the d.c. component across the series network of the deflection coil and the separating capacitor is maintained substantially constant in a simple manner.

In one embodiment the circuit is characterized in that the circuit provided in parallel with the separating capacitor is a clamping circuit comprising a switch which conducts in the first half of the trace period, the conducting interval of the switch ending substantially at the central instant of the trace period.

In a very simple embodiment the circuit is characterized in that the circuit provided in parallel with the separating capacitor comprises an element having a voltage drop which is substantially constant.

DESCRIPTION OF THE DRAWINGS

The invention will be further described by way of example with reference to the accompanying Figures.

DETAILED DESCRIPTION

Figure 1:
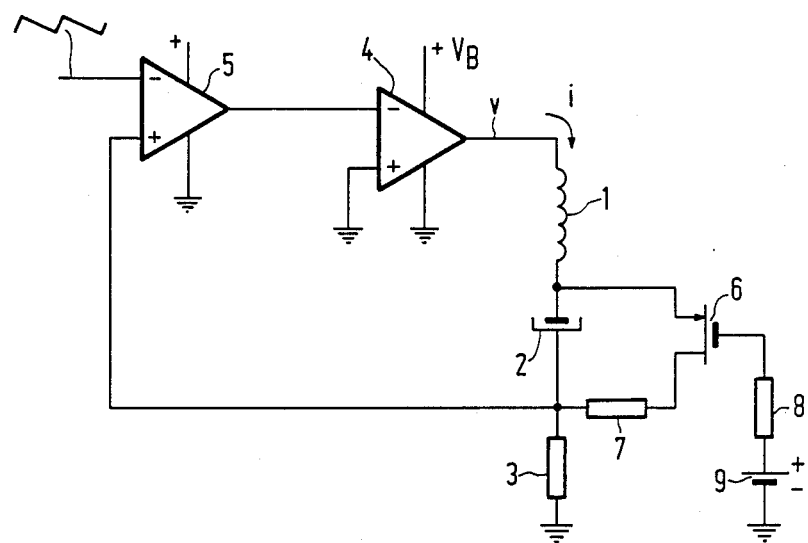
FIG. 1 shows an embodiment of the field deflection circuit according to the invention.

The field deflection circuit of FIG. 1 comprises a field deflection coil 1 for vertically deflecting the electron beam(s) which is (are) generated in a picture display tube not shown. A separating capacitor 2 and a negative feedback resistor 3 are arranged in series with coil 1 and the series network formed with element 1, 2 and 3 is connected between the output of an output amplifier 4 and ground. Amplifier 4 receives a supply voltage $V_B$ of, for example, 26 V the negative rail of which is also connected to ground. A sawtooth-shaped voltage of the field frequency is applied to the inverting input terminal of an input amplifier 5. This voltage is generated in known manner with respect to ground by a sawtooth generator. The non-inverting input terminal of amplifier 5 is connected, possibly through a resistor, to the junction of capacitor 2 and resistor 3. The output terminal of amplifier 5 is connected to the inverting input terminal of amplifier 4, the non-inverting input terminal of which is connected to ground. The amplified sawtooth voltage present at the inverting input terminal is converted by means of amplifier 4 into a current i which is the field deflection current flowing through coil 1. It will be evident that under circumstances the input amplifier 5 may be omitted in which case the input signal is applied directly to the non-inverting input terminal of amplifier 4 while the inverting input terminal is connected to the junction of elements 2 and 3.

Figure 2:
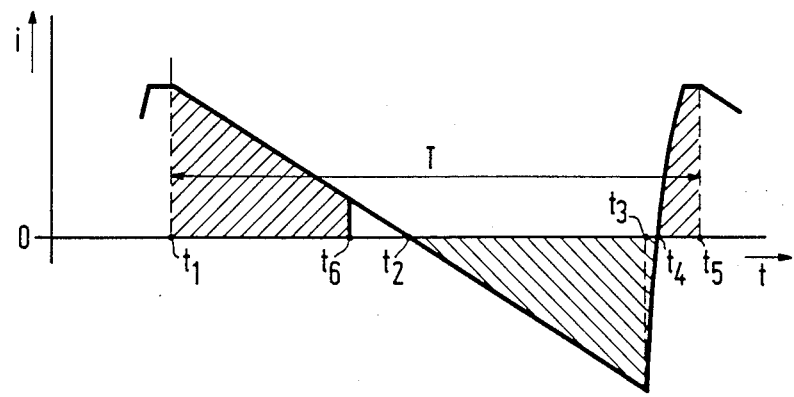
FIG. 2 shows a waveform occurring therein.

In FIG. 2 current is plotted as a function of time. During the greater part of the field period T, the trace period, current i decreases substantially linearly. The trace period commences at an instant $t_1$ and has a duration of approximately 19 ms for a period T of 20 ms (European television standard). Current i becomes zero approximately at the central instant $t_2$ of the trace period, whereafter it reverses its direction. At the final instant $t_3$ of the trace period, current i assumes a maximum negative value whose absolute value is substantially equal to the maximum positive value assumed at instant $t_1$. If the values of the input signal from amplifier 5 are symmetrical in absolute value with respect to instant $t_2$ between instants $t_1$ and $t_3$, the values of the output current i are also symmetrical, more specifically due to the negative feedback. This implies that the areas which are bounded in FIG. 2 by the line indicating current i and by the zero axis and which are located between instants $t_1$ and $t_2$ on the one hand and between instants $t_2$ and $t_3$ on the other hand are equal.

After instant $t_3$, current i increases very rapidly under the influence of a rapid transient in the input signal because the voltage present across the series network 1, 2, 3 is increased temporarily, for example, by raising the supply voltage. Under circumstances, such a retrace generator is not required. In all cases, $V_B$ indicates the value of the supply voltage of amplifier 4 during the trace period. At an instant $t_4$, current i again reverses its direction and subsequently reaches the maximum positive value. At an instant $t_5$, which is a period T later than instant $t_1$, another trace commences because the input signal again decreases slowly. The retrace period is the period between instants $t_3$ and $t_5$ and has a duration of approximately 1 ms. In this period the circuit does not form a negative feedback loop. In fact, the deflection coil which predominantly behaves as an ohmic resistance during the trace period now behaves as an inductance so that the current flowing therethrough slowly reacts to variations of the input signal. Consequently, the areas bounded in FIG. 2 by the line indicating current i and by the zero axis and which are located between instants $t_3$ and $t_4$ on the one hand and between instants $t_4$ and $t_5$ on the other hand, are not equal to each other. This means that capacitor 2 is charged during each field period with a charge which is equal to the difference between these areas. The result is an increase of the charge stored in the capacitor, and therefore an increase of the voltage across the capacitor into the direction of the supply voltage. Without any further measures, a serious distortion of the deflection current would be caused thereby.

The foregoing is well known to those skilled in the art. In accordance with the prior art the above described fault may be prevented by adapting the input signal and by the use of negative feedback networks provided between the series network 1, 2, 3 and an input terminal, for example, the non-inverting input terminal of amplifier 5. The negatively fed back frequency-dependent voltage thus obtained is added to the voltage which is obtained by the linear negative feedback with the aid of resistor 3.

The circuit of FIG. 1 does not comprise these frequency-dependent negative feedback networks, and during the trace period, the input signal does not comprise a correction component, for example, a parabolic component to take the effect described with reference to FIG. 2 into account. In FIG. 1 the source of a field effect transistor 6 is connected to the junction of coil 1 and capacitor 2, the drain electrode is connected via a limiting resistor 7 to the junction of capacitor 2 and resistor 3 and the gate electrode is connected via a resistor 8 to a d.c. voltage source 9, the other end of which is connected to ground. Elements 6 through 9 constitute a clamping circuit. During the trace period a parabolic voltage is present across capacitor 2 with a maximum at instant $t_2$. In the steady state the circuit is set in such a manner that transistor 6 conducts a short time before instant $t_2$. A current originating from capacitor 2 and whose direction is opposite to that of deflection current i, flows through the transistor so that the parabola peak is clamped at a fixed value. The superfluous charge caused by current i is removed from capacitor 2 by the current through transistor 6, and the total current through the capacitor is zero. At instant $t_2$ current i reverses its direction so that the charge of capacitor 2 decreases. Transistor 6 thus stops conducting and the voltage across capacitor 2 decreases with a parabolic shape.

The instant $t_6$ at which transistor 6 starts conducting is located such that the sum during one period of the areas shaded in FIG. 2 and located above the zero axis, i.e. the areas between instants $t_1$ and $t_6$ on the one hand and between instants $t_4$ and $t_5$ on the other hand is equal to the shaded area located below the zero axis, i.e. the area between instants $t_2$ and $t_4$. During one period, as much charge is applied to capacitor 2 as is removed therefrom, and the voltage across the capacitor does not increase. In other words, the current through the capacitor is a real alternating current. During the time interval between instants $t_6$ and $t_2$ a current flows through coil 1, transistor 6 and resistor 7. The mean value over one period of this current is a small d.c. component for current i. This component is a centering current for the vertical deflection. The desired value of the centering current may be adjusted in a simple manner by adding a d.c. component to the input signal from amplifier 5 so that the location in time of instant $t_6$ is set. It will be noted that the addition of transistor 6 and resistor 7 substantially does not have any influence on the shape of the deflection current. The reason is that this current is imposed by a current source.

During the trace period the voltage v present at the output of amplifier 4 is the sum of the sawtooth voltages present across coil 1 and resistor 3, and of the parabolic voltage present across capacitor 2. At instant $t_1$, voltage v is slightly lower than voltage $V_B$, and at instant $t_3$, the said voltage is slightly higher than zero. Amplifier 4 comprises, for example, a class-B output stage having in known manner two transistors, one of which conducts during the first half of the trace period and the other conducts during the second half of the trace period, while the voltages across the first-mentioned transistor is minimum at instant $t_1$ and across the second transistor at instant $t_3$. Due to the operation of the clamping circuit with elements 6 through 9, the voltage across capacitor 2 assumes a more or less fixed value at instant $t_2$.

The choice of this value is determined by practical considerations, inter alia, by the structure of the output stage in amplifier 4 and by the amplitude of the parabolic voltage across capacitor 2, hence by the value of the capacitance of the capacitor. A suitable dimensioning may ensure that the class-B output stage operates in the manner stated so that a favorable efficiency is obtained. When more specifically the parabola has a small amplitude because capacitor 2 has a high capacitance, a value of approximately 12 V may be chosen for the voltage of source 9 so that voltage v at instant $t_2$ has a value which is substantially equal to half the voltage $V_B$.

In the foregoing, the variation of current i during the trace period has been assumed to be linear. In practice, this current generally has an S-shape which can be obtained by using negative feedback networks. The deflection current may be given the desired shape by using the circuit of FIG. 1, because the input signal applied to amplifier 5 has this shape already. More generally, the linearity of the deflection current can be corrected by setting the input signal; i.e., at a low level.

FIG. 1 shows a given embodiment of the clamping circuit. In this circuit resistor 7 serves to limit the current flowing through transistor 6, and may under circumstances be omitted. Source 9 is shown as a battery. In practice, source 9 will be formed by using a resistor voltage divider between a supply voltage and ground, with the junction of the resistors possibly being decoupled to ground by means of a capacitor which may have a comparatively low capacitance thanks to the high impedance present in the gate lead of transistor 6. The maximum value, and hence the d.c. component of the trace voltage across capacitor 2, is fixed at a substantially constant value by means of the circuit comprising elements 6 through 9. This circuit may include a switch other than a field element effect transistor, for example, a Darlington combination and may also be formed in a different manner, for example, as a peak rectifier with the series network of a diode, whose anode is connected to the junction of capacitor 2 and coil 1, a d.c. voltage source and possibly a limiting resistor, which network is provided in parallel with capacitor 2. The diode conducts in the time interval $t_6$ to $t_2$. The d.c. voltage source may be formed with an RC parallel network. In another manner, a zener diode may be provided in parallel with capacitor 2, the anode thereof being connected to the junction with resistor 3 and the cathode being connected to the junction with coil 1. During operation the voltage across the zener diode is substantially constant so that the voltage across the capacitor 2 cannot exceed this value. A limiting resistor may also be provided in series with the zener diode. The zener diode may be replaced by a voltage-dependent resistor, or by the series network of a plurality of diodes whose anodes are coupled to the junction of coil 1 and capacitor 2, while their cathodes are coupled to the junction of capacitor 2 and resistor 3.

What is claimed is:

1. A field deflection circuit for use in a picture display device, comprising: an amplifier having an input terminal for receiving a sawtooth-shaped signal of the field frequency, and an output terminal for applying a sawtooth-shaped deflection current having a trace and a retrace to a series network of a field deflection coil; a separating capacitor and a negative feedback resistor coupled to the said output terminal; means for feeding back the voltage across the negative feedback resistor to the amplifier; and a parallel circuit in parallel with said separating capacitor for setting the d.c. component of the voltage across the capacitor at a substantially constant maximum value of a parabolic voltage present across the capacitor during the trace period, wherein the parallel circuit is a clamping circuit comprising a switch which conducts in the first half of the trace period, the conducting interval of the switch ending substantially at the central instant of the trace period, and wherein said switch has a relatively low impedance value during the first half of the trace period, and a relatively high impedance value during the second half of the trace period and during the retrace period.

2. A field deflection circuit as claimed in claim 1, wherein the switch is coupled to a d.c. voltage source whose voltage is substantially constant.

3. A field deflection circuit as claimed in claim 1, further comprising a limiting resistor in series with the switch having a substantially constant voltage drop.

4. A field deflection circuit as claimed in claim 2, wherein the source of the input signal, the coupling of the series network not coupled to the amplifier and the d.c. voltage source are coupled to a fixed reference potential.

* * * * *